(12) United States Patent
Hourai

(10) Patent No.: US 7,164,570 B2
(45) Date of Patent: Jan. 16, 2007

(54) EXCITATION CONTROL CIRCUIT FOR INTERMITTENTLY BYPASSING RETURN CURRENT

(75) Inventor: Yasuharu Hourai, Utsunomiya (JP)

(73) Assignee: Keihin Corporation, Tokyo (JP)

( * ) Notice: Subject to any disclaimer, the term of this patent is extended or adjusted under 35 U.S.C. 154(b) by 308 days.

(21) Appl. No.: 10/644,010

(22) Filed: Aug. 20, 2003

(65) Prior Publication Data

US 2004/0150433 A1 Aug. 5, 2004

(30) Foreign Application Priority Data

Oct. 9, 2002 (JP) ............................ P2002-296274

(51) Int. Cl.
*H01H 47/00* (2006.01)
*H01H 47/32* (2006.01)
(52) U.S. Cl. ...................................... 361/159
(58) Field of Classification Search ................. 361/159
See application file for complete search history.

(56) References Cited

U.S. PATENT DOCUMENTS 5,811,996 A * 9/1998 Oyabe et al. ............... 327/110
5,847,533 A * 12/1998 Hakala et al. .............. 318/798
5,933,312 A * 8/1999 Schuhbauer et al. ........ 361/152
5,953,198 A * 9/1999 Murata et al. .............. 361/195
6,140,717 A * 10/2000 Fischer et al. .............. 307/125

FOREIGN PATENT DOCUMENTS

| JP | 59-45209 B2 | 11/1984 |
| JP | 62-107527 U | 7/1987 |
| JP | 4-130604 A | 5/1992 |
| JP | 6-132116 | 5/1994 |
| JP | 6-132116 A | 5/1994 |
| JP | 7-29730 A | 1/1995 |

* cited by examiner

Primary Examiner—Stephen W. Jackson
Assistant Examiner—Ann T. Hoang
(74) Attorney, Agent, or Firm—Arent Fox PLLC

(57) ABSTRACT

An excitation control circuit for suitably exciting a solenoid while current consumption and heating are effectively reduced. The control circuit has a driving circuit for driving a coil of a solenoid in response to a pulse signal supplied from an external device; a counter-electromotive force absorbing circuit, inserted in a path of a return current of the coil, for absorbing counter-electromotive force produced by the coil; and a return current circuit, connected in parallel to the counter-electromotive force absorbing circuit, for intermittently bypassing the return current. The return current circuit may have a field effect transistor switched on according to a signal for defining the timing of bypassing the return current, where the current path of the transistor is connected between a positive electrode and a negative electrode of the coil.

7 Claims, 3 Drawing Sheets

EXCITATION CONTROL CIRCUIT FOR INTERMITTENTLY BYPASSING RETURN CURRENT

BACKGROUND OF THE INVENTION

1. Field of the Invention

The present invention relates to an excitation control circuit for exciting (or energizing) a coil of a solenoid, and in particular, relates to a technique for performing excitation while suppressing rapid attenuation of excitation current.

2. Description of the Related Art

Recently, in various technical fields such as a field for controlling mechanical vibration, solenoids are effectively used. In order to control the attraction of the solenoid (i.e., the operation when the coil of the solenoid is excited), the coil is excited by chopping or the like during the attraction, while in order to control the release of the solenoid (i.e., the operation when the coil is not excited), the coil is not energized during the release.

Here, counter-electromotive voltage (or force), which may damage the excitation control circuit, is produced when energization of the coil is terminated. Therefore, in a known technique, the counter-electromotive voltage is suitably absorbed using a flywheel diode or a Zener diode, and the absorbed voltage is returned to the coil. In addition, Japanese Unexamined Patent Application, First Publication No. Hei 6-132116 discloses an excitation control circuit having a combination of a flywheel diode and a Zener diode, so as to obtain desired attenuation characteristics of the coil in consideration of the counter-electromotive voltage.

FIG. 4 shows the general structure of the excitation control circuit having a combination of a flywheel diode and a Zener diode. In this conventional circuit, the switch 32 is turned on when the attracting operation of the solenoid is performed, and the coil 30 is excited by chopping via the driving circuit 20. The counter-electromotive force produced during chopping is returned via the diode 31 to the coil 30. When the solenoid is released, the switch 32 is turned off, and the counter-electromotive force produced due to the switching-off operation is absorbed by the Zener diode 12 and the diode 11, so that the absorbed force is returned to the coil 30.

More specifically, the coil 30 is a constituent of a solenoid (not shown), and the output of the driving circuit 20 is connected to the positive electrode (see the reference symbol P in FIG. 4) of the coil 30, and the negative electrode of the coil 30 is grounded. In addition, the counter-electromotive force absorbing circuit 10, which consists of the diode 11 and the Zener diode 12, is connected to the coil 30 in parallel, and the counter-electromotive force absorbing circuit 10 and the driving circuit 20 function as the excitation control circuit.

In this structure, when the driving circuit 20 stops excitation of the coil 30, counter-electromotive force is produced at the coil 30 so as to compensate the attenuation of the excitation current which flows through the coil 30. When the voltage of the counter-electromotive force exceeds the breakdown voltage of the Zener diode 12, return current IA flows through the counter-electromotive force absorbing circuit 10, so that the counter-electromotive force of the coil 30 is limited to a fixed level. That is, the Zener diode 12 absorbs a portion of the counter-electromotive force of the coil 30, thereby relieving the damage on the driving circuit 20.

However, in this conventional technique, the counter-electromotive force produced at the coil 30 during the release operation of the solenoid is absorbed by the Zener diode 12; thus, the current returning to the coil 30 is excessively attenuated. Therefore, in order to secure required attenuation characteristics in the release of the solenoid, the coil 30 must be strongly energized by the driving circuit 20. As a result, power consumption is increased.

In addition, the burden imposed on the Zener diode 12 is increased according to the counter-electromotive force produced by the coil 30, so that the heat generated by the Zener diode 12 is also greatly increased, which may affect the operations of other electronic parts or devices.

SUMMARY OF THE INVENTION

In consideration of the above circumstances, an object of the present invention is to provide an excitation control circuit for suitably exciting a solenoid while current consumption and heating are effectively reduced.

Therefore, the present invention provides an excitation control circuit comprising:

a driving circuit (e.g., a driving circuit 120 in an embodiment explained below) for driving a coil of a solenoid in response to a pulse signal supplied from an external device;

a counter-electromotive force absorbing circuit (e.g., a counter-electromotive force absorbing circuit 110 in the embodiment), inserted in a path of a return current of the coil, for absorbing counter-electromotive force produced by the coil; and a return current circuit (e.g., a return current circuit 130 in the embodiment), connected in parallel to the counter-electromotive force absorbing circuit, for intermittently bypassing the return current.

In a typical example, the return current circuit has a first transistor, whose current path is connected between a positive electrode and a negative electrode of the coil, wherein the first transistor is switched on according to a signal for defining the timing of bypassing the return current.

In this case, the counter-electromotive force absorbing circuit may include:

a second transistor whose current path is connected between the positive electrode and the negative electrode of the coil; and a control system for switching on the second transistor when an inter-terminal voltage of the second transistor in its current path exceeds a predetermined value.

In another typical example of the excitation control circuit, the counter-electromotive force absorbing circuit includes:

a transistor whose current path is connected between a positive electrode and a negative electrode of the coil; and a control system for switching on the transistor when an inter-terminal voltage of the transistor in its current path exceeds a predetermined value.

Each of the above-explained first transistor, the second transistor, and the transistor may be a field effect transistor and the inter-terminal voltage of the transistor is a voltage between a source and a drain of the field effect transistor.

According to the present invention, the return current due to the counter-electromotive force produced by the coil of the solenoid is intermittently bypassed; thus, excitation of the coil of the solenoid can be suitably controlled while power consumption and heating are effectively reduced.

DESCRIPTION OF THE PREFERRED EMBODIMENTS

Hereinafter, embodiments according to the present invention will be explained with reference to the drawings.

Figure 1:
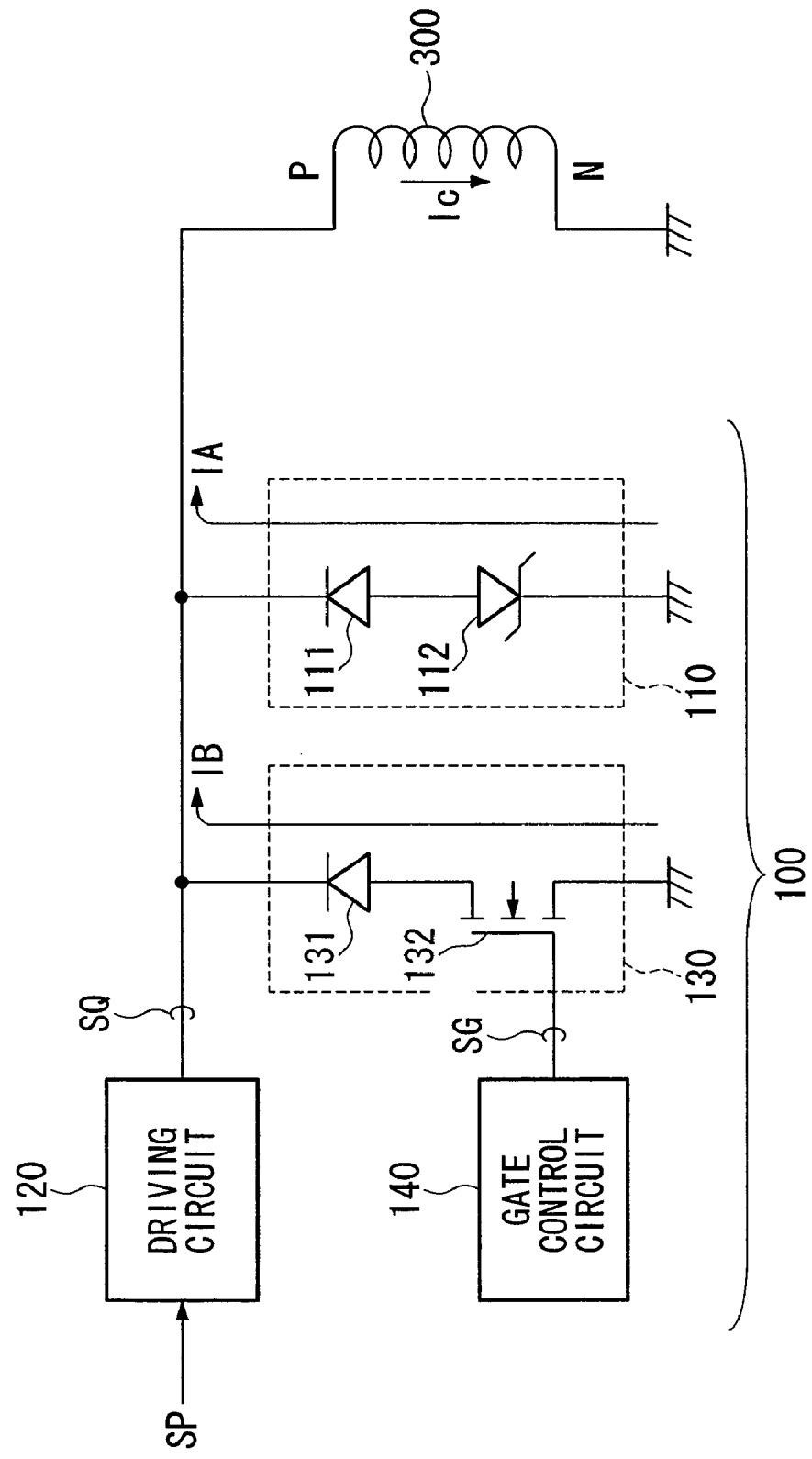
FIG. 1 is a diagram showing the structure of an excitation control circuit as an embodiment of the present invention.

FIG. 1 is a diagram showing the structure of the excitation control circuit (or return current control circuit) 100 in an embodiment. In the figure, the coil 300 is a constituent of a solenoid (not shown) whose excitation should be controlled by the excitation control circuit 100. The negative electrode of the coil 300 is grounded. The excitation control circuit 100 consists of the counter-electromotive force absorbing circuit 110, the driving circuit 120, the return current circuit 130, and the gate control circuit 140.

The driving circuit 120 drives the coil 300 in response to a pulse signal SP which is supplied from an external device. The output of the driving circuit 120 is connected to the positive electrode (see reference symbol P) of the coil 300. The pulse signal input into the driving circuit 120 is supplied from the external device which controls the attraction and release operation of the solenoid.

The counter-electromotive force absorbing circuit 110 consists of the diode 111 and the Zener diode 112, which are inserted in the path of the return current IA of the solenoid. The cathode of the diode 111 is connected to the positive electrode of the coil 300, and the anode of the diode 111 is connected to the anode of the Zener diode 112. The cathode of the Zener diode 112 is grounded and is thus connected to the negative electrode (see reference symbol N) of the coil 300.

The return current circuit 130 consists of the diode 131 and the n-type FET (field effect transistor) 132 and is connected in parallel to the counter-electromotive force absorbing circuit 110. More specifically, the cathode of the diode 131 is connected to the positive electrode P of the above-explained coil 30, and the anode of the diode 131 is connected to the drain of the FET 132. The source of the FET 132 is grounded. That is, the current path of the FET 132 is connected via the diode 131 between the positive electrode P and the negative electrode N of the coil 300. In addition, a control signal SG is supplied to the gate of the FET 132 from the gate control circuit 140. This control signal SG is used for defining the timing of bypassing the return current IA, which flows through the counter-electromotive force absorbing circuit 110, through the return current circuit 130, that is, the timing of making the return current IB flow through the return current circuit 130.

Below, the operation of the present embodiment will be explained with reference to the waveform diagram in FIG. 2.

Figure 2:
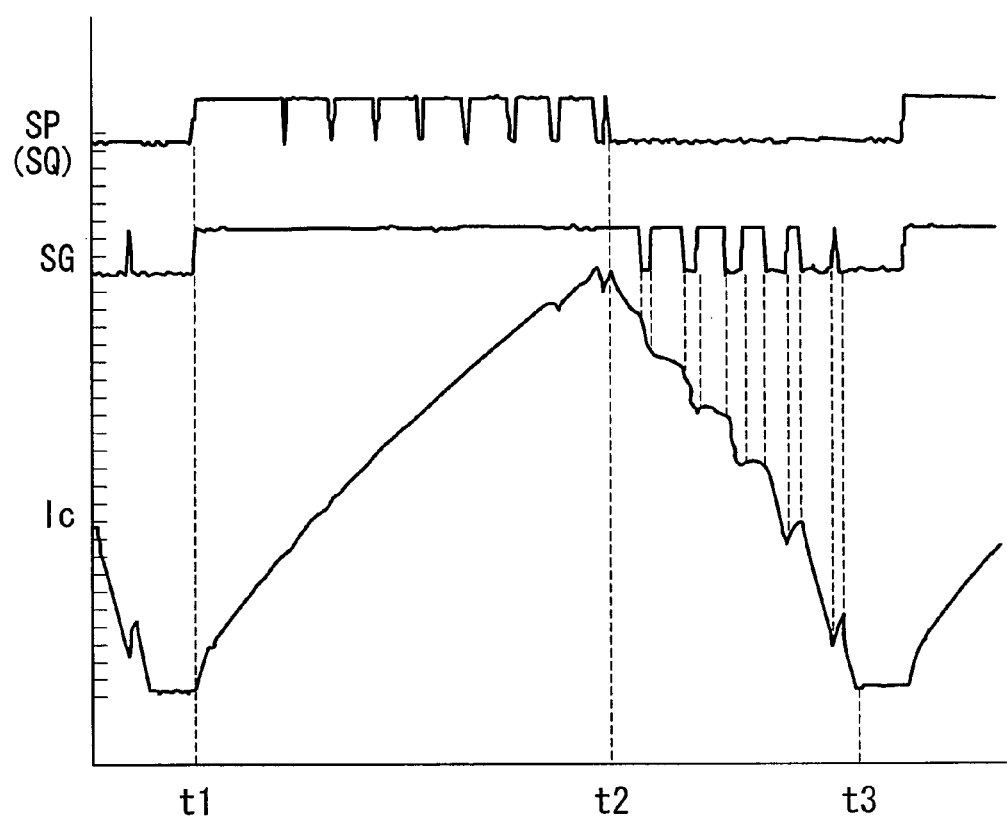
FIG. 2 is a waveform diagram for explaining the operation of the excitation control circuit in the embodiment.

As shown in FIG. 2, in the present embodiment, the excitation current Ic for the coil 300 is increased during the attracting operation of the solenoid, and when the operation of the solenoid is switched to the release state, the excitation current Ic is gradually decreased for a predetermined time.

More specifically, when the attracting operation of the solenoid is performed, the gate control circuit 140 fixes the level of the control signal SG to a high level at time t1, and simultaneously, the driving circuit 120, which receives the pulse signal SP, outputs the pulse signal SQ. Accordingly, the voltage of the pulse signal SQ is applied to the positive electrode P of the coil 300, so that the excitation current Ic starts to flow through the coil 300. In this process, the pulse width of the pulse signal SQ (i.e., SP) is suitably controlled so that the excitation current Ic of the coil 300 has a desired waveform at the rise of the signal.

When the operation of the solenoid is switched from the attraction to the release at time t2, the driving circuit 120 fixes the level of the pulse signal SQ to a low level. When the pulse signal SQ is fixed to the low level, excitation of the coil 300 is stopped and the excitation current Ic tends to attenuate. Therefore, counter-electromotive voltage is produced, in which the electric potential of the positive electrode P of the coil 300 is lower than the electric potential of the negative electrode N.

At the same time t2, the gate control circuit 140 starts to output a pulse signal as the control signal SG. While the level of the control signal SG is low, the FET 132, a constituent of the return current circuit 130, is controlled to be in an off-state.

Accordingly, the counter-electromotive voltage of the coil 300 is directly applied to the counter-electromotive force absorbing circuit 110, and when the counter-electromotive voltage exceeds the breakdown voltage of the Zener diode 112, the return current IA starts to flow. Therefore, the counter-electromotive force of the coil 300 is absorbed by the counter-electromotive force absorbing circuit 110. In this case, a relatively large amount of electric power is absorbed in accordance with the breakdown voltage of the Zener diode 112; thus, the excitation current Ic rapidly attenuates.

On the other hand, while the control signal SG has a high level, the FET 132 is controlled to be in an on-state; thus, the diode 131, which has sufficiently low forward voltage with respect to the breakdown voltage of the Zener diode 112, is activated. Consequently, the counter-electromotive voltage of the coil 300 is applied to the return current circuit 130, and the return current IA is bypassed as the return current IB by the return current circuit 130. In this case, a relatively small amount of electric power is absorbed according to forward voltage of the diode 131, so that attenuation of the excitation current Ic is moderate.

After time t2, the ON/OFF state of the FET 132 is intermittently changed in response to the control signal SG, and the return current IA is intermittently bypassed as the return current IB according to the operation of the FET 132. The return currents IA and IB are supplied as the excitation current Ic to the coil 300 while the currents IA and IB gradually attenuate, and the currents become 0 at time t3.

As explained above, according to the present embodiment, the magnetic energy, which has been stored at the coil 300 before time t2, is alternately released as the return current IA and the return current IB after time t2, where the currents IA and IB are respectively released by the counter-electromotive force absorbing circuit 110 and the return current circuit 130.

In this process, a relatively large amount of electric power (corresponding to the return current IA) is absorbed by the Zener diode 112 of the counter-electromotive force absorbing circuit 110; however, a portion of the counter-electromotive force is absorbed by the return current circuit 130, thereby suppressing the power consumption of the counter-electromotive force absorbing circuit 110. Therefore, it is possible to attenuate the excitation current Ic for a desired time while the counter-electromotive force of the coil 300 is effectively consumed, thereby securing required attraction and release operation of the solenoid.

Also according to the above embodiment, the magnetic energy, which has been stored at the coil 300 during the attraction operation, is gradually (i.e., incrementally) released as the return current during the release operation; thus, no extra energization for acquiring desired attenuation characteristics is necessary. Therefore, heating due to the power consumption can be reduced.

Also according to the above embodiment, desired attenuation characteristics of the excitation current Ic can be obtained by suitably setting the duty ratio of the control signal SG.

Here, the excitation current according to the present invention can be called a return current control circuit when considering the function of controlling the current to be returned to the coil, which is a constituent of the solenoid.

Figure 3:
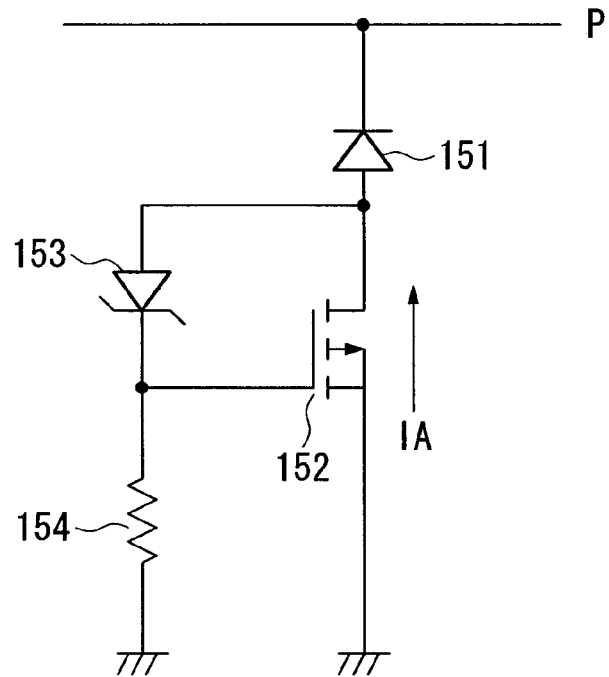
FIG. 3 is a diagram showing the structure of a variation of the counter-electromotive force absorbing circuit in the embodiment.
Figure 4:
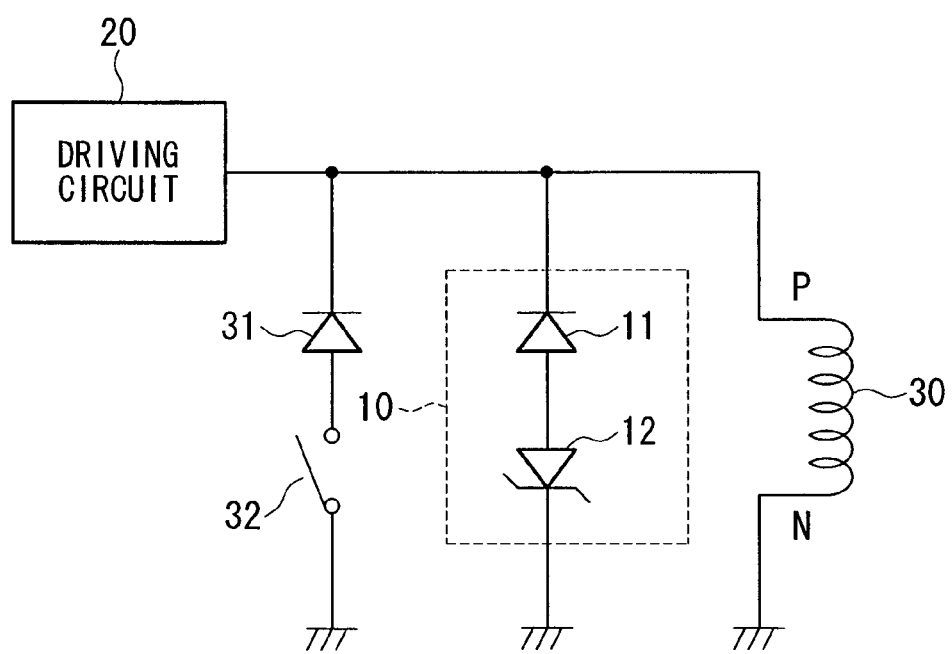
FIG. 4 is a diagram showing the structure of a conventional excitation control circuit.

FIG. 3 shows a variation of the counter-electromotive force absorbing circuit 110.

As shown in the FIGURE, the cathode of the diode 151 is connected to the positive electrode P of the above-explained coil 300, and the anode of the diode 151 is connected to the drain of the p-type FET 152. The source of the FET 152 is grounded. That is, the current path of the FET 152 is connected between the positive electrode P and the negative electrode N of the coil 300. In addition, the anode of the diode 151 is connected to the anode of the Zener diode 153, and the cathode of the Zener diode 153 is grounded via the resistor 154. The Zener diode 153 and the resistor 154 function as a control system for controlling the ON/OFF state of the FET 152.

The operation of the present circuit will be explained below. In the initial state before the counter-electromotive force is produced by the coil 300, the electric potential of the positive electrode P of the coil 300 is higher than that of the negative electrode N. In this initial state, the diode 151 is backward-biased; thus, the gate of the FET 152 is electrically disconnected from the positive electrode of the coil 300 and is fixed to the ground level via the resistor 154. Therefore, the source and the gate of the FET 152 have the same electric potential, so that the FET 152 is in an off-state.

When the driving circuit 120 stops excitation (i.e., the above initial state is terminated) and counter-electromotive force is produced at the coil 300, the electric potential of the positive electrode P of the coil 300 is decreased and becomes less than the electric potential of the negative electrode N, so that the diode 151 is forward-biased. Therefore, the anode of the Zener diode 153 is electrically connected via the diode 151 to the positive electrode of the coil 300, and this Zener diode 153 is backward-biased.

When the counter-electromotive force produced at the coil 300 exceeds a specific value and the inter-terminal voltage (i.e., the voltage between the source and the drain) of the FET 152 in its current path exceeds the breakdown voltage of the Zener diode 153, the gate of the FET 152 is electrically connected via the Zener diode 153 and the diode 151 to the positive electrode P of the coil 300, so that the gate voltage is decreased. Consequently, the FET 152 is switched on and the return current IA flows via the diode 151 and the FET 152. That is, similar to the structure shown in FIG. 1, the counter-electromotive force produced at the coil 300 can be absorbed by the circuit shown in FIG. 3.

According to the variation shown in FIG. 3, the counter-electromotive force is absorbed by the FET 152 instead of using a Zener diode which has a large device size; thus, the size of the entire circuit can be reduced. In addition, as the FET 152 absorbs the counter-electromotive force, heat radiation can be performed via the case of the circuit which functions as a heat sink. Furthermore, the counter-electromotive force produced by the coil 300 is charged (i.e., absorbed) by two devices, that is, the FET 132 of the return current circuit 130 shown in FIG. 1 and the FET 152 of the counter-electromotive force absorbing circuit 110 shown in FIG. 3; thus, the heating value per device can be reduced and thermal destruction of the devices for absorbing the counter-electromotive force can be prevented.

What is claimed is:

1. An excitation control circuit comprising:
   a driving circuit for driving a coil of a solenoid in response to a pulse signal supplied from an external device;
   a counter-electromotive force absorbing circuit, inserted in a path of a return current of the coil, for absorbing counter-electromotive force produced by the coil;
   a return current circuit connected in parallel to the counter-electromotive force absorbing circuit; and
   a control circuit for outputting a pulse signal for intermittently bypassing the return current through the return current circuit while the return current attenuates.

2. An excitation control circuit as claimed in claim 1, wherein the return current circuit has a first transistor, whose current path is connected between a positive electrode and a negative electrode of the coil, wherein the first transistor is switched on according to the pulse signal from the control circuit for defining the timing of bypassing the return current.

3. An excitation control circuit as claimed in claim 1, wherein the counter-electromotive force absorbing circuit includes:
   a transistor whose current path is connected between a positive electrode and a negative electrode of the coil; and
   a control system for switching on the transistor when an inter-terminal voltage of the transistor in its current path exceeds a predetermined value.

4. An excitation control circuit as claimed in claim 2, wherein the counter-electromotive force absorbing circuit includes:
   a second transistor whose current path is connected between the positive electrode and the negative electrode of the coil; and
   a control system for switching on the second transistor when an inter-terminal voltage of the second transistor in its current path exceeds a predetermined value.

5. An excitation control circuit as claimed in claim 2, wherein the first transistor is a field effect transistor.

6. An excitation control circuit as claimed in claim 3, wherein the transistor is a field effect transistor and the inter-terminal voltage of the transistor is a voltage between a source and a drain of the field effect transistor.

7. An excitation control circuit as claimed in claim 4, wherein the second transistor is a field effect transistor and the inter-terminal voltage of the second transistor is a voltage between a source and a drain of the field effect transistor.

* * * * *